(12) United States Patent
Humpston

(10) Patent No.: US 7,768,574 B2
(45) Date of Patent: Aug. 3, 2010

(54) COMPACT LENS TURRET ASSEMBLY

(75) Inventor: Giles Humpston, San Jose, CA (US)

(73) Assignee: Tessera, Inc., San Jose, CA (US)

( * ) Notice: Subject to any disclaimer, the term of this patent is extended or adjusted under 35 U.S.C. 154(b) by 1189 days.

(21) Appl. No.: 11/121,434

(22) Filed: May 4, 2005

(65) Prior Publication Data

US 2005/0248680 A1  Nov. 10, 2005

Related U.S. Application Data

(60) Provisional application No. 60/568,052, filed on May 4, 2004.

(51) Int. Cl.
*H04N 5/225* (2006.01)

(52) U.S. Cl. ........................ 348/374; 348/340

(58) Field of Classification Search .............. 348/335, 348/340, 373–376; 257/290–291, 294
See application file for complete search history.

(56) References Cited

U.S. PATENT DOCUMENTS

| 6,117,193 | A * | 9/2000 | Glenn .................. 29/25.01 |
| 6,342,406 | B1 | 1/2002 | Glenn et al. |
| 6,384,397 | B1 | 5/2002 | Takiar et al. |
| 6,455,774 | B1 | 9/2002 | Webster |
| 6,483,101 | B1 | 11/2002 | Webster |
| 6,665,455 | B1 * | 12/2003 | Ting .................. 382/312 |
| 6,683,298 | B1 | 1/2004 | Hunter et al. |
| 6,727,487 | B2 * | 4/2004 | Yamaguchi et al. ...... 250/208.1 |
| 2001/0030276 | A1 | 10/2001 | Hoshino |
| 2001/0048064 | A1 | 12/2001 | Kitani |
| 2001/0050721 | A1 * | 12/2001 | Miyake .................. 348/374 |
| 2002/0044213 | A1 | 4/2002 | Shinomiya et al. |
| 2002/0057468 | A1 | 5/2002 | Segawa et al. |
| 2002/0090803 | A1 | 7/2002 | Salaville |
| 2002/0140837 | A1 * | 10/2002 | Miyake et al. .............. 348/340 |
| 2002/0145676 | A1 | 10/2002 | Kuno et al. |
| 2004/0142539 | A1 | 7/2004 | Koizumi |
| 2004/0256687 | A1 * | 12/2004 | Omori .................. 257/433 |
| 2005/0041134 | A1 * | 2/2005 | Takayama ............... 348/340 |

(Continued)

FOREIGN PATENT DOCUMENTS

EP  1 148 716 A  10/2001

(Continued)

OTHER PUBLICATIONS

Humpston et al., U.S. Appl. No. 10/949,674, filed Sep. 24, 2004.

*Primary Examiner*—Sinh Tran
*Assistant Examiner*—Daniel M Pasiewicz
(74) *Attorney, Agent, or Firm*—Lerner, David, Littenberg, Krumholz & Mentlik, LLP

(57) ABSTRACT

An electronic camera module incorporates a sensor unit (20) having a semiconductor chip (22) such as a CCD imager and a cover (34) overlying the front surface of the chip. An optical unit (50) includes one or more optical elements such as lenses (58). The optical unit has engagement features (64) which abut alignment features on the sensor unit as, for example, portions (44) of the cover outer surface (38), so as to maintain a precise relationship between the optical unit and sensor unit.

20 Claims, 5 Drawing Sheets

U.S. PATENT DOCUMENTS

| | | |
|---|---|---|
| 2005/0056769 A1 | 3/2005 | Chen |
| 2005/0082653 A1 | 4/2005 | McWilliams et al. |
| 2005/0139848 A1 | 6/2005 | Yee |
| 2006/0044450 A1 | 3/2006 | Wolterink et al. |
| 2006/0109366 A1* | 5/2006 | Humpston et al. .......... 348/340 |

FOREIGN PATENT DOCUMENTS

| | | |
|---|---|---|
| EP | 1 475 960 A2 | 11/2004 |
| JP | 2000-004386 A | 1/2000 |
| JP | 2002-118776 A | 8/2002 |
| JP | 2002-290842 A | 2/2003 |
| JP | 2004-029554 A | 1/2004 |
| WO | WO-2004/010679 A | 1/2004 |
| WO | WO-2004/027880 A | 4/2004 |
| WO | 2005-041561 A1 | 5/2005 |

* cited by examiner

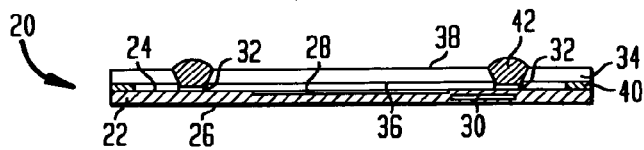
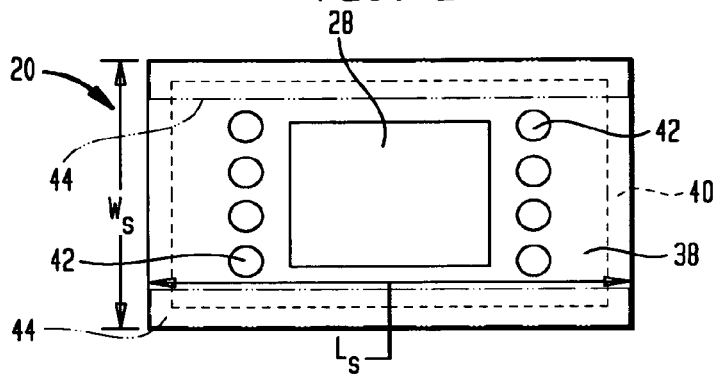
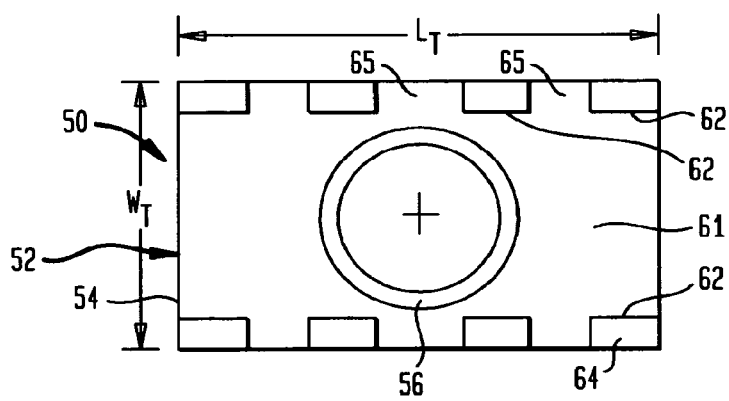
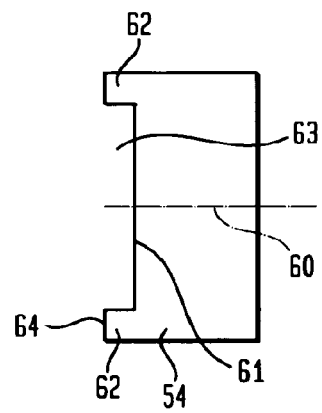
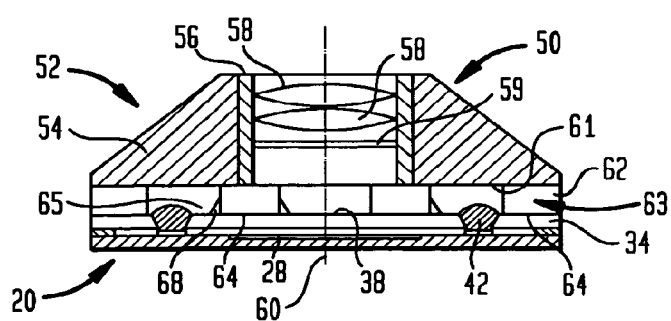

COMPACT LENS TURRET ASSEMBLY

CROSS-REFERENCE TO RELATED APPLICATIONS

The present application claims the benefit of the filing date of U.S. Provisional Patent Application No. 60/568,052, filed May 4, 2004, the disclosure of which is hereby incorporated herein by reference.

FIELD OF THE INVENTION

The present invention relates to the mounting and packaging of opto-electronic devices such as solid-state image sensors.

BACKGROUND OF THE INVENTION

Numerous electronic devices such as common electronic still cameras and video cameras include solid-state image sensors. A typical solid-state image sensor is formed in a semiconductor chip and includes an array of light-sensitive elements disposed in an area of the front surface of the chip, referred to herein as the "imaging area." A color-sensitive image-sensing chip may include arrays of elements sensitive to different wavelengths of light. Each light-sensitive element is arranged to generate an electrical signal representing light falling on a particular small portion of the imaging area. The semiconductor chip typically also includes internal electrical circuits arranged to convert these signals into a form intelligible to other elements of the device as, for example, into one or more streams of digital values representing the light falling on the various individual pixel areas.

Image sensing chips typically are used in conjunction with optical elements such as lenses which act to focus the image to be observed by the chip onto the active area, as well as wavelength-selective filters. The optical elements most commonly are mounted in a housing referred to as a "turret." Typically, both the turret and the chip are mounted, directly or indirectly, onto a supporting circuit panel, which supports and electrically interconnects various components of the device in addition to the image sensor. Many image sensor chips are supplied in packages which incorporate a dielectric enclosure surrounding the chip, with a transparent window overlying the imaging area of the chip. The enclosure is provided with terminals, so that the enclosure can be mounted on a circuit board with the imaging area and the overlying window facing upwardly away from the circuit board, and with the terminals connected to electrically conductive features of the circuit board. The turret can then be positioned over the package. These arrangements typically require a turret which occupies an area of the circuit board substantially larger than the area occupied by the chip package and substantially larger than the area occupied by the image-sensing chip itself. Stated another way, the area occupied by the turret in a plane parallel to the plane of the imaging area is substantially larger than the area occupied by the image sensing chip and substantially larger than the area occupied by the package which holds the image sensing chip. This increases the size of the overall device. This problem is particularly acute in the case of very compact devices as, for example, cameras incorporated in cellular telephones and personal digital assistants ("PDAs").

Moreover, it is important to position the optical elements mounted in the turret accurately with respect to the imaging area of the image-sensing chip. In particular, to achieve proper focusing of the image on the imaging area of the chip, it is desirable to position the optical axis of the lenses and other optical elements in the turret precisely perpendicular to the plane of the imaging area, and to place the lenses at a desired height above the imaging area. The need for such precise positioning complicates the design of the assembly and, in some cases, may further aggravate the turret size problem noted above.

Another approach which has been suggested is to mount a bare or unpackaged image-sensing chip directly to a turret. In such an arrangement, it would theoretically be possible to achieve good positioning of the chip relative to the optical elements in the turret. However, image-sensing chips are susceptible to mechanical damage and to chemical attack by atmospheric contaminants. Thus, the turret in such an arrangement typically must include arrangements for holding the bare chip in a sealed environment. Moreover, bare imaging sensing chips are extremely sensitive to particulate contamination. As discussed above, each optically-sensitive element provides an electrical signal representing the light falling in a small element of the image, commonly referred to as a picture element or "pixel." If a particle lands on a particular optically sensitive element, it will block light directed onto that element, so that the resulting signals will show the pixel as dark. When the image is reconstructed from the signals, it will have a dark spot at the affected pixel. Any process which requires assembly of a bare chip with a turret must be conducted under stringent conditions to minimize particulate contamination. Moreover, such processes often suffer from high defect rates caused by particulate contamination. Both of these factors tend to increase the cost of the resulting assemblies. Moreover, these assemblies as well typically require turrets having areas substantially larger than the area of the chip itself.

Thus, there are substantial needs for improved opto-electronic assemblies and assembly methods.

SUMMARY OF THE INVENTION

One aspect of the invention provides an opto-electronic assembly referred to as a camera module. The module according to this aspect of the invention most preferably includes a sensor unit incorporating a semiconductor chip having a front surface with an imaging area. The chip desirably includes an imaging circuit adapted to generate signals representative of an optical image impinging on the imaging area. The sensor unit preferably also includes a cover overlying the front surface of the chip, the cover having a transparent area aligned with the imaging area of the chip. The cover has an outer surface facing in a forward direction away from the chip. The sensor unit most preferably has one or more features, referred to herein as "alignment features," exposed at the outer surface of the cover. The alignment features lie in a predetermined spatial relationship to the imaging area of the chip. For example, the alignment features may lie in a plane parallel to the plane of the imaging area of the chip. In one arrangement, the outer surface of the cover is entirely or partially planar, and the alignment features are simply portions of the planar surface.

The module most desirably includes an optical unit which has one or more optical elements, as, for example, a turret having one or more lenses. The optical unit has one or more engagement features engaged with the one or more alignment features of the sensor unit. The engaged features at least partially position the optical unit, and hence the optical elements, relative to said imaging area of said chip.

The module desirably includes electrical terminals electrically connected to the chip. These terminals may be mounted on the optical unit as, for example, on the turret, and may be electrically connected to contacts exposed at the outer surface of the cover in the sensor unit, which in turn are connected to contacts on the semiconductor chip. The unit can be handled as a single piece and mounted to a circuit panel or socket. The module may be compact, and may have horizontal dimensions, in directions parallel to the plane of the chip front surface, equal to or only slightly larger than the corresponding dimensions of the sensor unit and chip. For example, the horizontal area of the entire module (its area in a plane parallel to the plane of the chip front surface) may be equal to or less than 1.2 times the horizontal area of the chip or sensor unit.

In another arrangement, a circuit panel may extend between the sensor unit and the optical unit, and conductors on the circuit panel may be in contact with contacts exposed at the outer surface of the sensor unit cover. The circuit panel typically has a hole aligned with the imaging area of the semiconductor chip. Because the sensor unit and optical unit are disposed on opposite sides of the circuit panel, the height or protrusion of the unit on one side of the circuit panel is minimized. In this arrangement, the circuit panel most preferably does not extend between the alignment features of the sensor unit and the engagement features of the optical unit. For example, the circuit panel may have holes aligned with these features, so that the alignment features, the engagement features or both extend through these holes.

A further aspect of the present invention provides methods of making optical modules. In methods according to this aspect of the invention, a plurality of turrets are assembled with a starting unit which includes a plurality of semiconductor chips and, most preferably, also includes plural covers associated with these chips. For example, the starting unit may include a wafer or a portion of a wafer together with a unitary cover element. Desirably after assembling the turrets to the starting unit, the starting unit is severed so as to provide individual modules.

BRIEF DESCRIPTION OF THE DRAWINGS

FIG. 1 is a diagrammatic sectional view of a sensor unit used in one embodiment of the invention.

FIG. 2 is a top plan view of the sensor unit shown in FIG. 1.

FIG. 3 is a bottom plan view of an optical unit used with the sensor unit of FIGS. 1 and 2.

FIG. 4 is a side elevational view of the optical unit shown in FIG. 3.

FIG. 5 is a diagrammatic sectional view of a module according to one embodiment of the invention, formed from the units of FIGS. 1-4.

DETAILED DESCRIPTION

Figure 6:
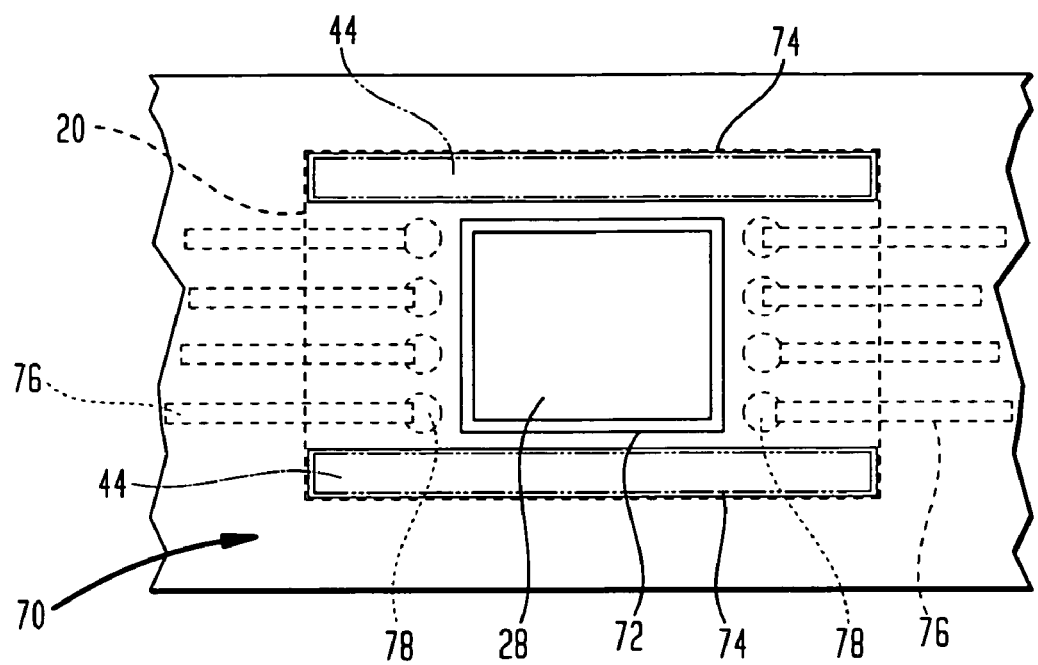
FIG. 6 is a top plan view of a circuit panel together with a sensor unit.

A module in accordance with one embodiment of the present invention includes a sensor unit 20 (FIGS. 1 and 2). Sensor unit 20 includes a semiconductor chip 22 having a front or top surface 24 and an oppositely directed rear or bottom surface 26. Front surface 24 includes an imaging area 28. Chip 22 includes electronic circuits, schematically indicated at 30 in FIG. 1, for generating one or more electrical signals representing an optical image impinging on imaging area 28. Numerous electrical circuits are well known in the imaging art for this purpose. For example, the semiconductor chip 22 may be a generally conventional charge-coupled device (CCD) imaging chip with conventional circuits such as clocking and charge-to-voltage conversion circuits. Any other conventional circuits may be used. Chip 22 has electrical connections or contacts 32 exposed at front surface 24 and electrically connected to the internal circuitry 30.

Sensor unit 20 also includes a cover 34 having an inner or bottom surface 36 and an outer or top surface 38. The cover overlies the front surface 24 of chip 22, with the outer surface 38 facing upwardly away from the front surface. Cover 34 is physically attached to chip 22 and sealed to the chip by a sealant or bond material 40. At least that region of the cover 34 which overlies the imaging area 28 is substantially transparent to light in the range of wavelengths to be imaged by the structure. In the particular embodiment illustrated, cover 34 is a unitary slab of a transparent material such as a glass or polymeric material, so that the entirety of the cover is transparent to light. Sensor unit 20 further includes metallic electrical connections 42 extending from chip contacts 32 through the cover 34, such that connections 42 are exposed at the top or front surface 38 of the cover. These connections 42 serve as the contacts of the overall sensor unit, so that the sensor unit, including chip 22, can be electrically connected to external structures through these contacts or connections 42. As shown in FIG. 2, connections or contacts 42 do not occupy the entire area of the outer or top surface 38. Thus, the outer or top surface 38 includes land regions 44 (FIG. 2) which are offset from connections or contacts 42 in horizontal directions, along the plane of the outer surface and parallel to the plane of the imaging area. The land regions 44 are integral with the remainder of the top surface and are shown in broken lines in FIG. 2 to indicate that these regions are physically indistinguishable from the remainder of the top surface 38.

Land regions 44 of top surface 38 are in a predetermined spatial relationship with the imaging area 28 of chip 22. The front surface, including the land regions, is substantially planar and substantially parallel to the plane of the planar imaging area 28. Also, the front surface lies at a well-controlled height above the plane of imaging area 28. The land regions 44 are also referred to herein as the "alignment features" of the sensor unit. Merely by way of example, front surface 38 of cover 34 may be parallel to the plane of the imaging area within about 2 arc seconds and may be within about 5 microns of a nominal height above imaging area 28. The sensor unit may be fabricated in accordance with U.S. Published Patent Application No. 2005/0082653, published Apr. 21, 2005, and co-pending, commonly assigned U.S. patent application Ser. No. 10/949,674, filed Sep. 24, 2004, the disclosures of which are hereby incorporated by reference herein. As described in further detail in the aforementioned applications, such units can be fabricated in a wafer scale or partial wafer scale process, in which a large cover layer is bonded to a wafer or a portion of a wafer incorporating numerous semiconductor chips, the electrical connections are made, and then the resulting assemblage is severed to form numerous individual sensor units.

An optical unit 50 (FIGS. 3, 4 and 5) includes a turret 52 which, in the particular embodiment depicted, includes both an outer shell 54 and an inner barrel 56 mounted to the outer shell 54. The optical unit further includes optical elements such as lenses 58 mounted to the inner barrel 56 of the turret, as well as one or more wavelength-selective filters 59, also mounted within barrel 56. The optical elements, and particularly lenses 58, are arranged along an optical axis 60, and are arranged to focus an image onto a plane perpendicular to this axis. Barrel 56 is mounted for adjustment in upward and downward directions along the optical axis. The barrel and outer shell 54 may be provided with elements such as screw threads or cam surfaces for controlling the position of the barrel, and hence of the optical elements, relative to the outer shell in the direction along axis 60. Alternatively, the barrel and shell 54 may be arranged so that the barrel is slideable in the axial direction relative to the outer shell 54, and so that the barrel can be fixed in position relative to the outer shell once it has been adjusted to a desired position as, for example, by applying a small ultrasonic or solvent weld between these elements, or by applying an adhesive to fix the barrel in position relative to the shell.

The shell 54 of turret 52 has a main surface 61 facing downwardly or rearwardly and has two sets of rear elements 62 projecting downwardly or rearwardly from this main surface. Each set of rear elements 62 is arranged in a row along one edge of the turret. Rear elements 62 have planar surfaces 64 facing downwardly or rearwardly, away from the remainder of the turret. These surfaces 64 are coplanar with one another and thus cooperatively define a planar rear engagement surface disposed below the main surface 61. This surface 64, defined by the various rear elements 62, is perpendicular to the optical axis 60 to within a closely controlled tolerance. The spaced-apart rows of rear elements 62 define a groove 63 (FIGS. 3 and 4) extending across the bottom of the turret in the lengthwise direction (from the left to the right in FIG. 3). Also, the rear elements 62 within each row are spaced-apart from one another so as to define smaller gaps 65 extending in from the opposite longitudinal edges of the shell and merging with groove 63.

Shell 54, and hence turret 52 as a whole, has horizontal dimensions, in a plane perpendicular to optical axis 60, approximately equal to or slightly smaller than the corresponding dimensions of sensor unit 20. That is, the lengthwise dimension $L_T$ (FIG. 3) of turret 52 is equal to or less than the lengthwise dimension $L_S$ (FIG. 2) of sensor unit 20, and the widthwise dimension $W_T$ (FIG. 3) of the turret is equal to or less than the widthwise dimension $W_S$ (FIG. 2) of the sensor unit.

In the assembled module (FIG. 5), turret 52 overlies the outer surface of cover 38. The rear elements 62 of the turret are aligned with the land regions 44 (FIG. 2) of the cover, so that rear elements 62 are offset in the widthwise direction from connections 42 and from imaging area 28. The optical axis 60 of the optical unit is aligned with the center of imaging area 28 of the sensor unit. The rear engagement surface 64, defined by rear element 62 on the turret, abuts the land regions 44 (FIG. 2). Because the cover outer surface 38 of the sensor unit and, hence, the surface in land regions 44, are precisely parallel to the plane of imaging area 28, and because the rear engagement surface 64 of the optical unit is perpendicular to optical axis 60, the optical axis 60 is positioned perpendicular to the plane of imaging area 28 to within a small tolerance. Also, because outer surface 38 of the cover and land regions 44 lie at a precise elevation above imaging area 28, the optical elements such as lenses 58 will lie at precise heights above the imaging area.

The module can be maintained in this assembled condition by adhesive 68 (FIG. 5) disposed along the edges of the unit as, for example, within some portion of the spaces 65 between adjacent rear elements 62 of the turret. In a variant of this approach, the adhesive may extend between the confronting rear engagement surface 64 of the turret and outer surface 38 of the sensor unit cover. However, the thickness of any such adhesive in this area should be small and well-controlled, so that it does not cause substantial variation in spacing between the confronting surfaces of the turret and sensor unit. In a further variant, the adhesive may be replaced by a metallic bonding material such as a solder, provided that the land regions 44 of the cover and the rear engagement elements 62 are solder-wettable. In a still further variant, the turret 52 of the optical unit may be clamped against the sensor unit by a spring clip or other mechanical clamping device having sufficient strength to maintain engagement between the rear engagement surfaces 64 and the land areas of the cover. The engaged surfaces 64 and 44 in this embodiment do not control the positioning of the optical module relative to the sensor module in horizontal directions, parallel to the plane of the imaging area 28 in the sensor unit. Relative positioning of the units in the horizontal directions can be controlled by engaging the units with fixtures (not shown) during assembly. Particularly precise alignment in the horizontal directions normally is not required.

The main surface 61 of turret 52 is supported above the front surface 38 of the cover 34 and above the electrical connections or contact 42 of the sensor unit. The groove 63 in the bottom of the turret and, hence, the space between the turret main surface and the sensor unit extend to the ends of the module (at the right and left in FIG. 5), so that electrical connections can be made by conductors (not shown) extending into the module beneath main surface 61 through groove 63. Similarly, conductors can extend into the space between the main surface 61 and the outer surface 38 of the sensor unit cover, through the spaces 65 between adjacent rear elements 62 along the lengthwise edges of the module.

Figure 7:
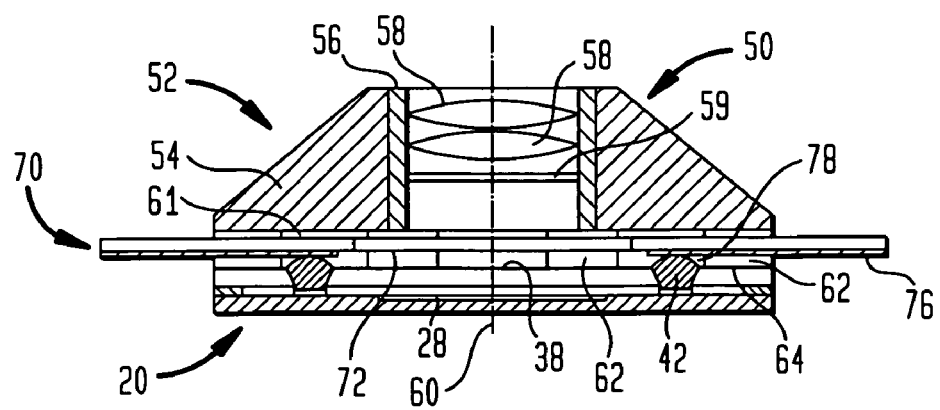
FIG. 7 is a diagrammatic sectional view of an assembly including the circuit panel and sensor unit of FIG. 6 and an optical unit.

In one arrangement, the conductors extending into the module are conductors of a circuit panel. As seen in FIG. 6, a circuit panel such as a rigid or flexible circuit panel 70 is provided with a hole 72 slightly larger than the imaging area 28 of the sensor unit, and with slots 74 slightly larger than the land regions 44 of the sensor unit cover. The circuit panel has conductors 76 on its bottom surface, these conductors terminating in contact pads 78, arranged in a pattern corresponding to the pattern of contacts 42 on the sensor unit 20. The sensor unit 20 is mounted to the bottom side of the circuit panel, with hole 72 roughly aligned with imaging area 28 and with slots or apertures 74 roughly aligned with the land areas 44 of the cover surface. Contacts 42 of the sensor unit are bonded to the pads 78 of the circuit panel and thus electrically connected to conductors 76. For example, the sensor unit can be mounted to the circuit panel using conventional solder-bonding techniques. The turret 52 of the optical unit is positioned generally above circuit panel 70. The main surface 61 of the turret lies above the circuit panel. However, rear elements or projections 62 of the turret project downwardly through the slots or apertures 74 in the circuit panel 70, so that the rear engagement surface 64 of the turret is engaged with the land regions 44 on cover outer surface 38 in the manner discussed above. Thus, the rear engagement surface and the land regions of the cover surface function as discussed above to maintain precise perpendicularity between the optical axis 60 of the optical elements of the turret and the plane of the imaging area, as well as precise control of the height of the optical elements above the imaging area. Circuit panel 70 may be a small modular circuit panel which may be connected to other elements of the circuit. Alternatively, circuit panel 70 may be a main circuit panel carrying other electronic elements of the device. The circuit panel extends in the space between the main surface 61 of the turret and the cover top surface. This arrangement provides a very low-height assembly; the height of the assembly above the circuit panel (towards the top of the drawing in FIG. 7) is less than the overall height of the turret. Stated another way, this arrangement allows positioning of the sensor unit on one side of a circuit panel and the turret on the opposite, while maintaining precise positioning of the turret relative to the sensor unit. The turret may be secured in place by adhesive bonding or otherwise fastening the turret to the circuit panel or to the sensor module. However, the circuit panel 70 does not control the relative positioning of the turret and the imaging area. During manufacture, either the turret or the sensor unit may be mounted to the circuit panel first. Where the sensor unit is mounted first, it can be tested in conjunction with other electronic components on the circuit panel prior to mounting the turret. Because the sensor unit is a sealed unit with the cover in place, the assembly process need not incorporate the stringent measures required for handling bare sensor chips.

Figure 8:
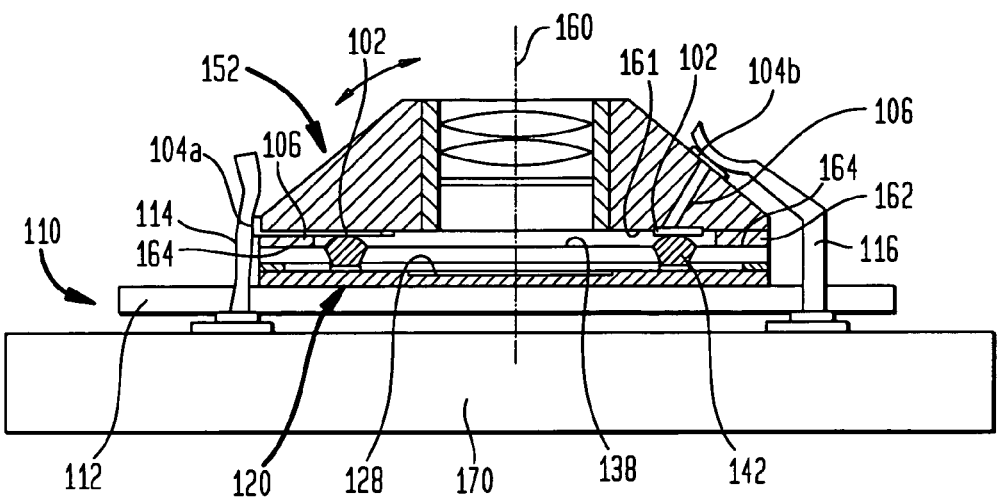
FIGS. 8, 9 and 10 are diagrammatic sectional views of assemblies according to further embodiments of the invention.

A module in accordance with a further embodiment of the invention (FIG. 8) incorporates an optical unit with a turret 152 and a sensor unit 120 generally similar to those discussed above. Here again, the module has features such as rear engagement elements 162 defining a rear engagement surface 164 disposed below the main surface 161 of the module. Once again, the rear engagement surface 164 is engaged with the outer or top surface 138 of the cover on the sensor unit 120, so that the turret, and hence the optical axis 160 of the optical components, is maintained precisely perpendicular to the plane of the imaging area 128 in the sensing unit. In the module of FIG. 8, however, the turret 152 has contact pads 102 exposed at main surface 161 and facing downwardly or rearwardly, towards the sensor unit 120. Contact pads 102 are offset horizontally from the rear engagement elements 162 and are recessed vertically upwardly, relative to the rear engagement surface 164 defined by the engagement elements. Turret 152 further includes terminals 104 disposed on exterior surfaces of the turret which will be exposed in the completed module. Thus, the terminals 104a at the left in FIG. 8 are disposed along an edge of the turret, whereas terminals 104b are disposed on an upwardly facing sloped exterior surface of the turret. Contact pads 102 and terminals 104 are connected to one another by leads 106. Some of these leads, such as the leads between terminals 104a and contact pads 102 extend along the main surface 161 of the turret in regions offset from the rear engagement elements 162, whereas other leads, such as the leads schematically shown between terminals 104b and pads 102, may extend through the turret. Still other leads (not shown) may extend in or on other surfaces of the turret, but desirably do not extend on the rear engagement surface 164. During assembly of the module, the electrical connections or contacts 142 of the sensor unit are electrically connected to contact pads 102. For example, the electrical connection 142 may be solder-bonded to contacts 102 or attached using a conductive adhesive (not shown), or metallurgically-bonded to the contacts as, for example, by diffusion or eutectic bonding. This bonding process may be performed at the same time as the rear engagement surface 164 of the turret is brought into engagement with the outer surface 138 of the sensor module. Desirably, during the bonding operation, some or all of the bonding materials, contacts 142, contact pads 102 can yield or move so that the contacts 142 and contact pads 102 do not constrain movement of the turret 152 towards the sensor unit 120. For example, in a solder-bonding operation, solder forming a portion of contact pads 102 or contacts 142, or both, may soften or melt so as to allow free movement of the turret toward the sensor unit, and thus allow full engagement of the rear engagement surface 164 with the outer surface 138 of the sensor unit. After solidification of the solder bonds, the solder bonds between the contacts 142 and contact pads 102 may serve to hold the turret in mechanical engagement with the sensor unit. A conductive adhesive or other bonding conductive system may be used in place of a solder. In a further alternative, contact pads 102 may be displaceable relative to the remainder of the turret. Also, an additional adhesive (not shown) or a mechanical fastener such as a spring clip or clamp (not shown) may be provided to hold the turret in engagement with the sensor unit, as discussed above. It is not essential that the contacts 142 of the sensor unit be bonded to the contact pads 102. For example, the contacts 142 may be in the form of pins or other projecting conductive elements, whereas the contact pads may be in the form of small sockets adapted to receive such pins and to make electrical connection with the pins. Other configurations which will establish electrical contact when brought into mechanical engagement with one another can be substituted for a pin and socket connection.

In the embodiment of FIG. 8, the module, and particularly the configuration of the turret 152 and terminals 104, is selected so that the module can be releasably engaged with a socket, with the terminals being in electrical contact with the socket. As seen in FIG. 8, the terminal is positioned in a socket 110 incorporating a socket base 112, a first set of upwardly projecting socket contacts 114 and a second set of socket contacts 116. Socket contacts 116 extend upwardly from socket base 112 and extend inwardly toward the socket contacts 114. Contacts 114 and 116 are resilient, so that the module can be tilted to disengage it from the socket or to re-engage it with the socket, as indicated by the double-ended arrow in FIG. 8. When the socket is engaged, the resilience of the contacts holds the rear surface of the chip in the sensor unit 120 against the socket base 112 and also provides contact pressure so that contacts 104a are firmly engaged with the first contacts 114, whereas contacts 104b are firmly engaged with second contacts 116. Socket base 112 may be permanently mounted to a circuit board 170, so that the socket contacts 114 and 116 are electrically connected to other elements mounted on the circuit panel (not shown). In a variant, the socket base may be formed integrally with the circuit panel. Releasable mounting of the module to the socket and circuit panel provides significant advantages in production. Defects in the module or in the other elements of the circuit may not be detectable until after the module has been mounted to the circuit panel. By making this mounting releasable, it is possible to reclaim the module where the other elements are defective, or to reclaim the other elements where the module is defective, without operations such as desoldering and solder-bonding, typically required to remove a permanently-mounted module and replace it with another. The particular socket design depicted in FIG. 8, and the matching configuration of terminals 104 on the module, are only illustrative. The module can be configured to mate with any form of socket.

A module according to a further embodiment of the invention (FIG. 9) has a turret 252 with an upstanding portion 253 housing the optical elements, and has terminals 204 extending upwardly along this portion. Such a module can be engaged in a socket 210, formed as a hole extending through a circuit board 270 and having socket contacts 214 arrayed around the hole. In this configuration, the upstanding portion 253 of the module desirably projects at least partially through the circuit board. In a further variant, terminals 204 of the module are replaced by pins projecting upwardly from the upper surface of the module, around the upstanding portion, so that the entire module can be engaged in a similar circuit board having a hole which receives the upstanding portion and having individual pin-receiving sockets surrounding such hole.

Figure 9:
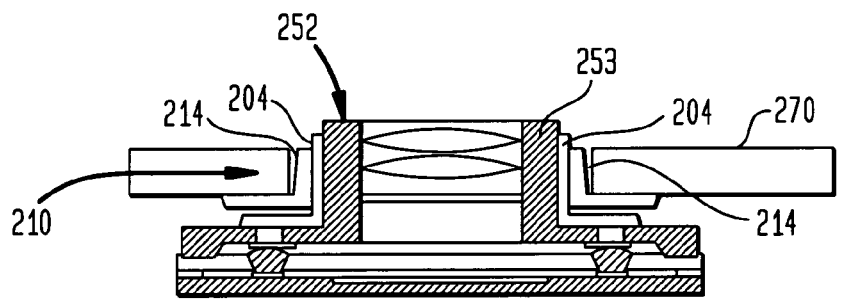

In the module of FIG. 9, turret 252 is formed as a single, unitary part, without the moveable or adjustable barrel discussed above with reference to FIG. 5. The optical elements, such as lenses 258, are mounted directly to this unitary piece. This aspect of the construction shown in FIG. 9 can be utilized in any of the other embodiments discussed herein.

Figure 10:
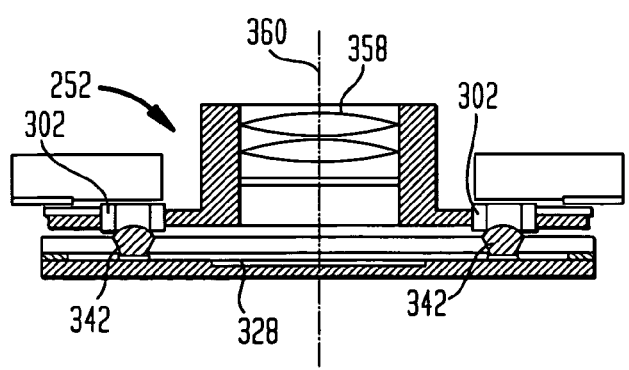

A module according to a further embodiment of the invention (FIG. 10) incorporates a turret 352 similar to the turrets discussed above. However, turret 352 does not incorporate a rear engagement surface, as discussed above. In the embodiment of FIG. 10, the features used to control positioning of the turret relative to the sensor unit 320 are metallic features, rather than features integral with the remaining structure of the turret itself. Features 302 may be in the form of metallic pads or vias. These pads or vias are formed in a precise positional relationship to those features of turret 352 which engage the optical elements 358, so that features 302 lie in a preselected positional relationship to the optical axis 360 of the optical elements 358. The electrical connections or contacts 342 on the sensor unit 320 engage features 302. Stated another way, the electrical connections 342 constitute the engagement features which control positioning of the sensor unit relative to the turret and thus control positioning of the imaging area 328 of the semiconductor chip relative to the optical axis. In this embodiment, contacts 342 desirably are formed from materials which remain substantially rigid during the assembly process. For example, connections 342 may include small, high-melting metallic spheres or bumps projecting above the outer or top surface 338 of the cover of the sensor unit. Connections 342 may include so-called "solid-core" solder balls which incorporate a core formed from a relatively high-melting material such as copper or copper-coated steel and a thin coating of a solder. Alternatively, contacts 342 may be formed from a relatively rigid metallic material having a thin coating of gold, silicon or other metal suitable for diffusion-bonding to features 302. In this embodiment, contacts 342 desirably are placed in a precise positional relationship with the imaging area 338. For example, all of these contacts desirably have substantially the same height above the imaging area. As in the embodiments discussed above, engagement between the features of the turret and the features of the sensor unit positions the turret relative to the imaging area.

In the embodiment of FIG. 10, vias or features 302 are electrically connected to terminals 304 disposed on an outer surface of turret 352. Terminals 304 are adapted for surface-mounting to features of a circuit panel 370. Desirably, the connection between features 342 of the sensor unit and features 302 of the turret 352 is arranged so that it will withstand the temperatures encountered in surface-mounting and reflow.

In a variant of the approach shown in FIG. 10, the turret 352 and sensor unit 320 can be provided with additional features similar to features 302 and 342, which are not electrically connected in the system and which are used solely for alignment and mechanical engagement between the sensor unit and optical unit. Where such additional features are provided, the electrical connections can be made in any of the ways discussed herein connection with other embodiments.

Figure 11:
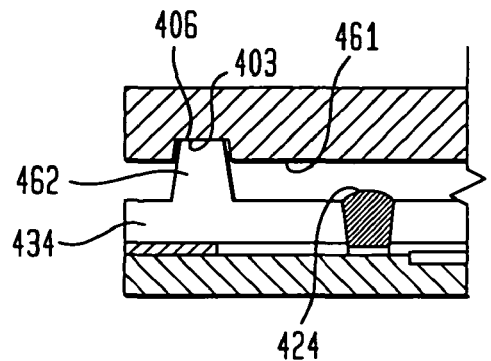
FIGS. 11 and 12 are fragmentary sectional views depicting portions of modules according to further embodiments of the invention.

In the embodiments discussed above, the cover on the optical unit is substantially flat. Such as flat cover is advantageous, in that it is simple to make the cover with an accurate, flat configuration with a controlled thickness. However, in a variant (FIG. 11), the flat cover can be replaced by a cover 434 having a plurality of upstanding projections 402 (only one of which is shown in FIG. 11) cooperatively defining an upwardly-facing exposed engagement surface 403 substantially parallel to the plane of the imaging area 428 on sensor chip 422. The turret 452 may be provided with recessed engagement surfaces 406 disposed slightly above the downwardly-facing main surface 461 of the turret. Alternatively, main surface 461 may be flat, and engagement surfaces 404 of the cover may be engaged with the main surface. Here again, the main surface 461 may be elevated slightly above the top surface 438 of the cover, so that the top surface and main surface of the cover define a gap between these two surfaces for access to the electrical connections 424.

In another embodiment (FIG. 12), the engagement features of sensor unit 520 constitute regions 502 of the front surface on the semiconductor chip 522. Regions 502 are exposed at the outer or top surface 538 of the cover 534 by holes 504 extending through the cover 534. As used in this disclosure with reference to a feature and a surface of a structure, a feature is said to be "exposed at" a surface when such feature is not covered by any other element of the structure, as seen in a view looking toward the surface from outside of the structure. Thus, surface regions 502 of chip 522 are exposed at outer surface 538, inasmuch as these portions 502 are not covered by any other element of sensor unit 520 when seen from above, looking down at surface 538. Using this same definition, features which project from the surface are also "exposed at" the surface. For example, projecting surfaces 403 on projections 402 of cover 434 (FIG. 11) are also "exposed at" the outer surface 438 of the sensor unit, whereas recessed surfaces 406 on turret 452 are exposed at the main surface 461 of the turret. Similarly, rear engagement surfaces 64 (FIGS. 3 and 4) are exposed at main surface 61 of turret 52. Likewise, land regions 44 of cover top surface 38 (FIG. 2), which are flush with the remainder of surface 38, are exposed at surface 38.

Figure 12:
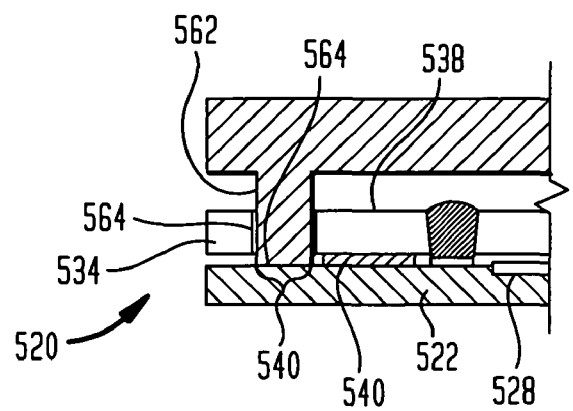

In the embodiment of FIG. 12, turret 552 is provided with projecting rear engagement elements 562 which define an engagement surface 564. Engagement surface 564 abuts or engages surface regions 502 of the chip 522. Holes 504 desirably lie outside of the area enclosed by the seal 540 of optical unit 520, and hence do not provide a path for chemical or particulate contamination of imaging area 528 or other components of chip 522. The region of chip 522 outside of seal 540 may be provided with a robust passivation layer (not shown).

In an alternative arrangement, the region of cover 534 occupied by holes 504 may be entirely omitted, so that the cover 534 terminates inboard of the edges of chip 522, leaving edge regions of the chip exposed. The arrangements discussed with reference to FIGS. 11 and 12 can be used in embodiments incorporating a circuit panel extending between the turret and the cover of the optical unit, in the manner discussed with reference to FIGS. 6 and 7.

Figure 13:
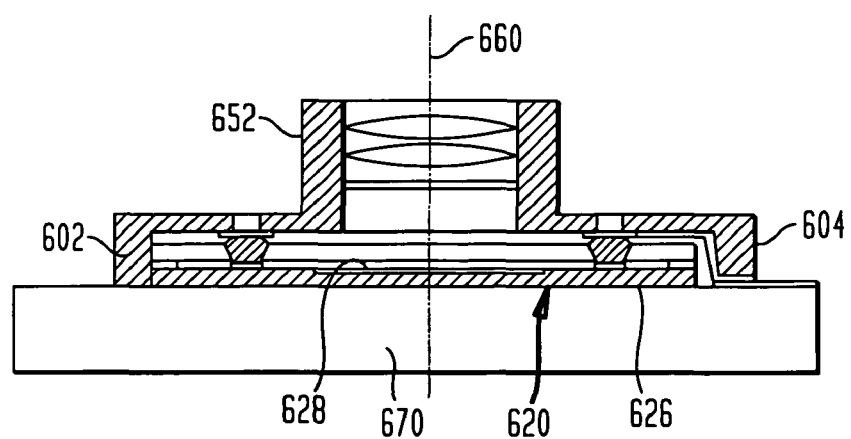
FIG. 13 is a diagrammatic sectional view of an assembly according to yet another embodiment of the invention.
Figure 14:
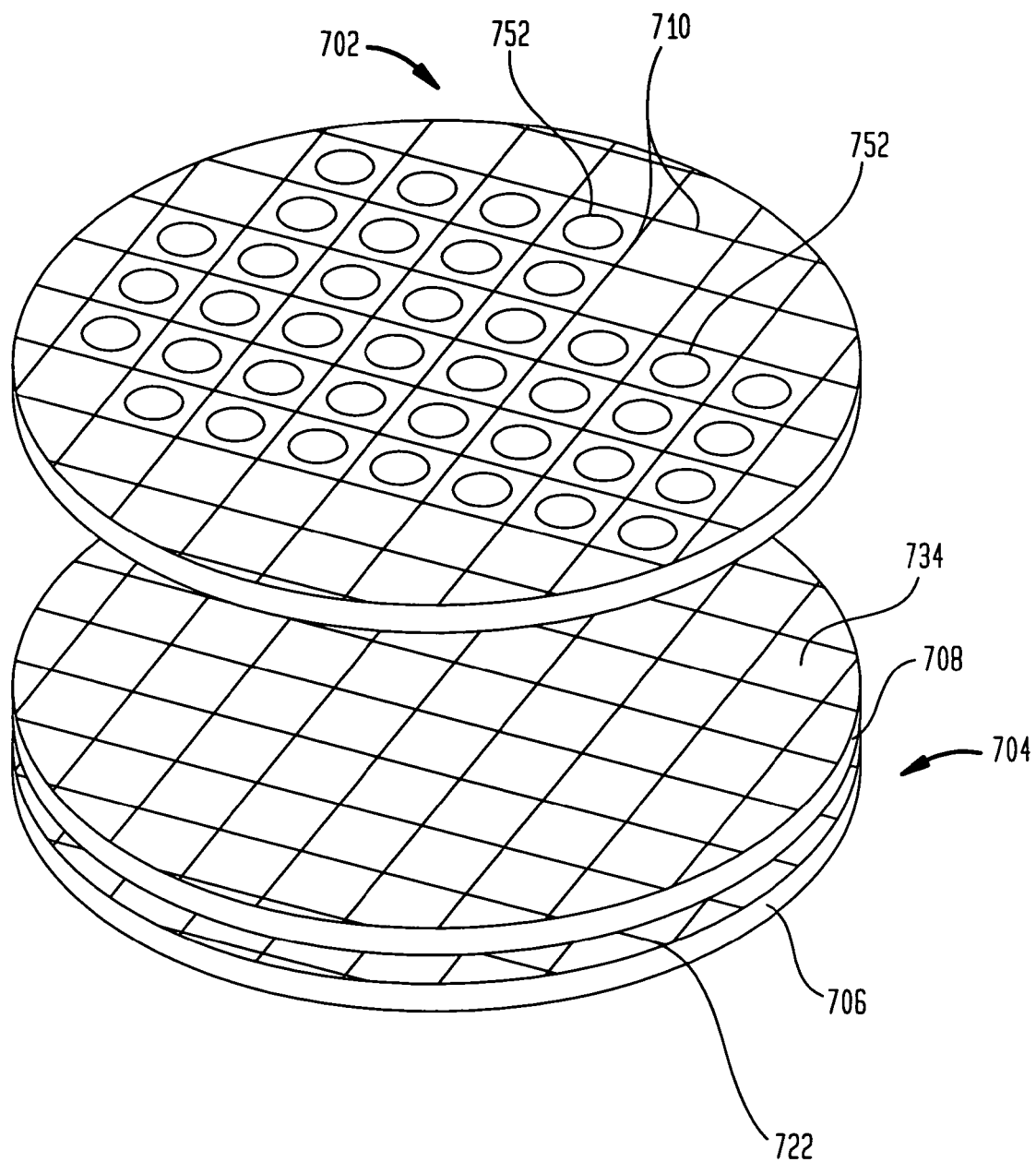
FIG. 14 is a diagrammatic perspective view depicting components during a manufacturing process according to a further embodiment of the invention.

In the embodiments discussed above, the turret of the optical module has horizontal dimensions and hence area equal to or smaller than the corresponding dimensions and area of the optical unit. This provides an extremely compact module. In a variant shown in FIG. 13, turret 652 has at least one dimension in a horizontal direction, perpendicular to optical axis 660 and parallel to the plane of imaging area 628, which is larger than the corresponding dimension of optical unit 620. The turret may incorporate a lip 602 projecting downwardly from the remainder of the turret. An edge of optical unit 620, such as an edge defined by the semiconductor chip or the cover, may be brought into abutment with such a lip so as to locate the optical unit relative to the turret in a horizontal direction. Also, the turret may be provided with another downwardly-projecting element 604 such as one or more lips or posts extending downwardly to the vicinity of the chip, and desirably downwardly to the vicinity of the chip rear surface 626. Projecting element 604 desirably carries one or more terminals 606, which in turn, is electrically connected to the sensor unit 620 in any of the ways discussed above. A module according to this embodiment may be surface-mounted on a circuit board 670 in a "face-up" arrangement, with the turret projecting upwardly away from the circuit board. Desirably, the horizontal dimensions of the module, even in this embodiment, do not greatly exceed the horizontal dimensions of the optical unit. Most preferably, the turret 652 occupies a horizontal area (measured in a plane perpendicular to the optical axis 660 and parallel to imaging area 628) no more than about 1.2 times the area of the optical unit 620 itself.

Modules according to certain embodiments of the present invention may be fabricated in groups. In one fabrication process, a turret element 702, including a plurality of individual turrets 752, is assembled with a starting unit 704. The starting unit 704 incorporates a wafer 706, including a plurality of image-sensing semiconductor chips 722, as well as unitary cover sheet 708 which includes a plurality of individual covers 734. Starting unit 704 may be assembled by assembling the cover sheet 708 to wafer 706 in the manner discussed in greater detail in the aforementioned co-pending commonly assigned patent applications incorporated by reference herein. Turret element 702 may be a unitary body incorporating portions defining each of the turrets. Although lines of demarcation 710 are shown extending between the various turrets 752 of the turret element, these lines of demarcation may or may not be visible in the actual practice. Similarly, lines of demarcation may or may not be visible between the individual covers 734 of the cover sheet and between the individual chips 722 of the wafer. The assembly process is performed so as to align the optical axis of each turret with the imaging area (not shown) in an associated chip 722, and hence align the optical axis of each turret with one cover 734 of the cover sheet.

As in the embodiments discussed above, certain aspects of the positioning are controlled by engaged features of the turrets and sensor units, as discussed above. Where the turret element 702 is rigid, it is not essential that engagement features be provided on every individual turret. The process of assembling the turret element to the starting unit may be performed before, during or after formation of the starting unit. In the embodiment shown, cover sheet 708 is attached to wafer 706 before turret element 702 is attached to the cover sheet. However, in a variant of the process, the turret element may be attached to the cover sheet before the cover sheet is attached to the wafer, or at the same time as the cover sheet is attached to the wafer. After assembly, the turret element as well as the starting unit are severed along the lines indicated by demarcation line 710 so as to separate the various turrets and the various portions of the starting unit into individual modules, each including one turret 752 and the associated chip 722 and cover 734. The optical elements, such as the lenses discussed above, may be assembled with the turrets either before or after assembly of the turrets with the starting unit.

In a variant of this process, the starting unit may include less than an entire wafer. In a further variant, the starting unit may include separately formed, individual covers rather than a unitary cover sheet. In a further variant, the severing operation is performed so as to provide modules, each including a plurality of turrets rather than a single turret. The severing operation can be performed using a saw of the type commonly employed to separate individual semiconductor chips from one another in a wafer-dicing operation.

In the embodiments discussed above, the semiconductor chips are arranged to form images in response to visible light. However, the invention may be employed in systems which use ultraviolet and/or infrared light in addition to, or in lieu of, visible light. Therefore, as used in the present disclosure, references to light and/or optical components should be understood as not restricted to visible light.

Numerous other variations and combinations of the features discussed above can be utilized without departing from the present invention. In one such variation, the sensor unit has contacts exposed at a rear surface rather than on a front surface, so that the contacts are exposed at the surface opposite of the sensor unit from the turret. Accordingly, the foregoing description should be understood as illustrating rather than as limiting the invention as defined by the claims.

The invention claimed is:

1. A camera module comprising:
   (a) a sensor unit including a semiconductor chip having a front surface facing in a forward direction with an imaging area and an imaging circuit adapted to generate signals representative of an optical image impinging on said imaging area, said sensor unit also including a cover having a transparent area aligned with said imaging area, said cover overlying said front surface and being secured to said chip, said cover having an outer surface facing in the forward direction away from said chip, said sensor unit having one or more alignment features exposed at said outer surface, said one or more alignment features being in predetermined spatial relationship to said imaging area of said chip, said sensor unit further having contacts electrically connected to the imaging circuit; and
   (b) an optical unit including one or more optical elements, said optical unit having one or more engagement features engaged with said one or more alignment features of said sensor unit so that the engaged features position said optical elements relative to said imaging area of said chip in the forward direction so as to control the distance in the forward direction between the optical elements and the sensor unit; and
   (c) a circuit panel having conductors, said circuit panel extending between said optical unit and said cover but not extending between said engagement features of said optical unit and said alignment features of said unit, at least some of said contacts being electrically connected to at least some of said conductors of said circuit panel.

2. The module as claimed in claim 1 wherein said one or more alignment features engaged with said one or more alignment features of said sensor unit include at least a part of said outer surface of said cover facing in said forward direction.

3. The module as claimed in claim 2 wherein said outer surface of said cover includes a substantially planar region facing in said forward direction and said one or more engagement features of said optical unit include one or more rear elements defining a substantially planar rear engagement surface engaged with said substantially planar region of said outer surface facing in said forward direction.

4. The module as claimed in claim 3 wherein said rear elements of said optical unit are offset from said contacts.

5. The module as claimed in claim 4 wherein said optical unit includes a turret supporting said one or more optical elements, said turret defining said engagement features of said optical unit.

6. The module as claimed in claim 5 wherein said turret includes electrically conductive pads facing toward said sensor unit, said pads being offset from said one or more rear elements, at least some of said contacts being electrically connected to at least some of said pads.

7. The module as claimed in claim 6 further comprising a socket having electrically conductive elements, said module being releasably engaged in said socket, at least some of said terminals being in electrical contact with at least some of said electrically conductive elements of said socket.

8. The module as claimed in claim 1 wherein said one or more alignment features of said sensor unit include one or more elements projecting forwardly from said outer surface of said cover.

9. The module as claimed in claim 8 wherein at least some of said projecting elements are electrically conductive contacts electrically connected to said chip.

10. The module as claimed in claim 9 wherein said optical unit includes a turret supporting said optical elements and wherein said engagement features of said optical unit include electrically conductive pads on said turret facing toward said unit, at least some of said contacts being mechanically engaged with at least some of said pads and electrically connected to at least some of said pads.

11. The module as claimed in claim 10 wherein said turret has an exterior surface and one or more terminals exposed at said exterior surface, at least some of said terminals being electrically connected to at least some of said pads.

12. The module as claimed in claim 11 wherein said turret and said unit are constructed and arranged so that the module is adapted to be releasably engaged in a socket with at least some of said terminals in releasable electrical contact with at least some electrically conductive elements of said socket.

13. The module as claimed in claim 1 wherein said imaging area of said chip is substantially planar, said optical elements are arranged along an optical axis and said engaged features position said optical unit so that said optical axis is substantially perpendicular to said imaging area.

14. The module as claimed in claim 1 wherein said optical unit includes a turret supporting said one or more optical elements, said turret and said sensor unit each having horizontal area in a plane perpendicular to said forward direction, the horizontal area of said turret being 1.2 times the horizontal area of said sensor unit or less.

15. The module as claimed in claim 14 wherein said chip has a horizontal area and wherein the horizontal area of said turret is 1.2 times the horizontal area of said chip or less.

16. The module as claimed in claim 14 wherein said horizontal area of said turret is equal to or less than the horizontal area of said sensor unit.

17. The module as claimed in claim 1 wherein said one or more optical elements include one or more lenses.

18. The module as claimed in claim 1 wherein said imaging area of said chip is substantially planar, said optical elements are arranged along an optical axis and said engaged features position said optical unit so that said optical axis is substantially perpendicular to said imaging area.

19. The camera module as claimed in claim 1 wherein said circuit panel has one or more apertures therein and at least some of said engagement features of said optical unit, said alignment features of said sensor unit or both extend through said one or more apertures.

20. The camera module as claimed in claim 1 wherein said optical elements include at least one lens positioned forwardly of said circuit panel.

* * * * *